US006762796B1

(12) United States Patent
Nakajoh et al.

(10) Patent No.: US 6,762,796 B1
(45) Date of Patent: Jul. 13, 2004

(54) IMAGE PICKUP MODULE HAVING INTEGRATED LENS AND SEMICONDUCTOR CHIP

(75) Inventors: Yasuo Nakajoh, Niiza (JP); Yutaka Yunoki, Kunitachi (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/368,445

(22) Filed: Aug. 4, 1999

(30) Foreign Application Priority Data

Aug. 10, 1998 (JP) .......................................... 10-225956

(51) Int. Cl.[7] .............................................. H04N 5/225
(52) U.S. Cl. ...................................................... 348/340
(58) Field of Search ................................ 348/340, 374; 257/432, 433

(56) References Cited

U.S. PATENT DOCUMENTS

| | | | | |
|---|---|---|---|---|
| 4,594,613 A | * | 6/1986 | Shinbori et al. | 250/208.1 |
| 5,274,456 A | | 12/1993 | Izumi et al. | |
| 5,302,778 A | * | 4/1994 | Maurinus | 250/208.1 |
| 5,359,190 A | * | 10/1994 | O'Regan et al. | 250/208.1 |
| 5,400,072 A | | 3/1995 | Izumi et al. | |
| 5,673,083 A | * | 9/1997 | Izumi et al. | 348/340 |
| 5,821,532 A | * | 10/1998 | Beaman et al. | 250/239 |
| 5,861,654 A | * | 1/1999 | Johnson | 257/433 |

FOREIGN PATENT DOCUMENTS

| | | |
|---|---|---|
| JP | 6-177271 | 6/1994 |
| JP | 2630965 | 4/1997 |
| JP | 9-181287 | 7/1997 |
| JP | 9-232548 | 9/1997 |
| JP | 9-238286 | 9/1997 |
| JP | 10-41492 | 2/1998 |

* cited by examiner

*Primary Examiner*—Wendy R. Garber
*Assistant Examiner*—Rashawn N. Tillery
(74) *Attorney, Agent, or Firm*—Frishauf, Holtz, Goodman & Chick, P.C.

(57) ABSTRACT

An image pick-up module of the present invention is such that, on one surface of the substrate 2, a positioning reference surface P constituted of an equally flattened surface is defined, the positioning reference surface P includes a semiconductor chip positioning surface portion, a frame member mounting surface portion at which a frame member 10 is joined and mounted, and a mirror frame positioning reference surface portion at which a mirror frame position 21 is joined upon being mounted and positioned, in which the semiconductor chip 1 and lens frame member are positioned on the positioning reference surface constituted of the equally flattened surface defined on the one surface of the substrate while using the reference surface portion at which at the semiconductor chip 1 is joined and positioned and reference surface portion at which the lens frame member is joined and positioned.

19 Claims, 6 Drawing Sheets

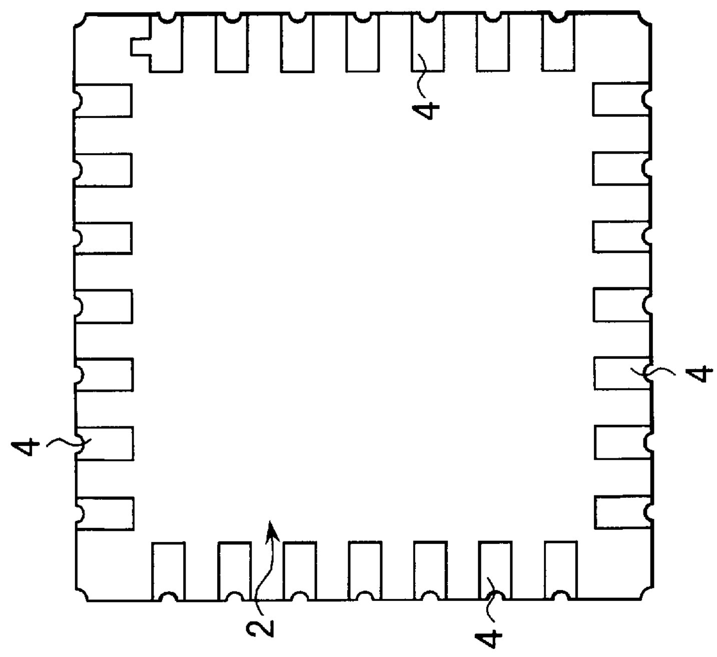
FIG. 3C
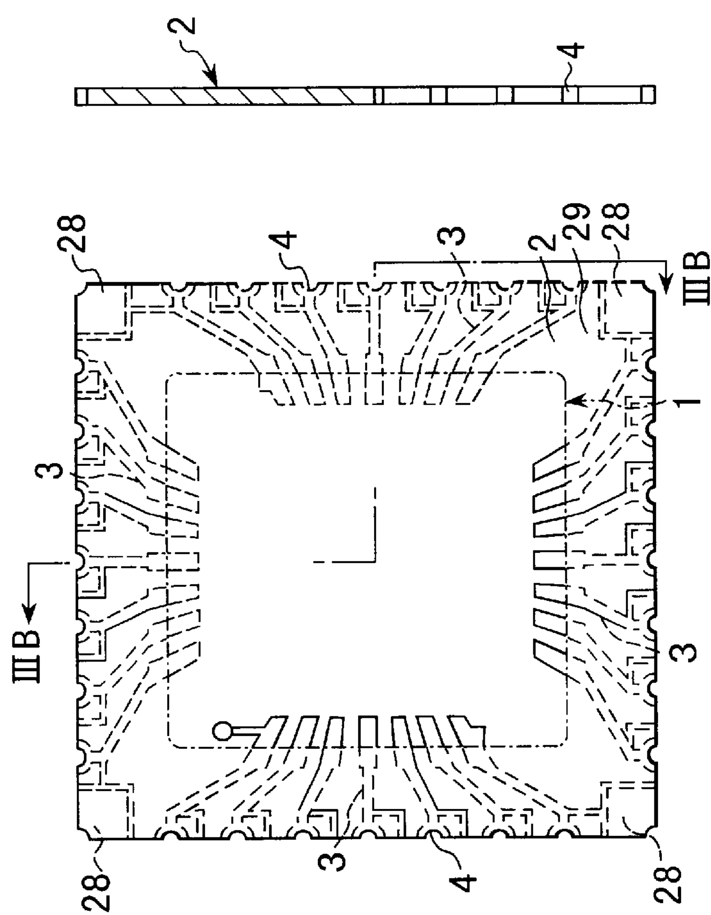
FIG. 3B
FIG. 3A

IMAGE PICKUP MODULE HAVING INTEGRATED LENS AND SEMICONDUCTOR CHIP

BACKGROUND OF THE INVENTION

The present invention relates to an image pick-up module and, in particular, to an image pick-up module with a lens and image pick-up semiconductor chip integrally incorporated in one package.

In recent years, a growing demand has been made for a compact image sensor in various kinds of multimedia fields and for devices including information terminals, such as a monitor camera, tape recorder. As a compact type image sensor unit suitable to this kind of image input devices, there is an integral unit package with a solid-state image pick-up element, lens member, filter, stop member, etc., incorporated therein.

In a conventional sensor unit, after a solid-state image pick-up element has been mounted on a substrate, the substrate is joined to the package with the use of screws, bonding, etc., while, on the other hand, a support frame with a lens member held thereon is mounted on the package. Due to such a structure, no adequate accuracy has been abled to be secured for the positional relation of the lens to the solid-state image pick-up element.

In the conventional sensor unit, the positioning accuracy of the lens relative to the solid state image pick-up element was poor and, therefore, a movable focus adjusting mechanism was incorporated into the package for focus setting and, after the assembly of each component part into the package, the focus setting was made by the focus adjusting mechanism relative to the solid image pickup element.

However, a focus setting operation, that is, the operation of the movable adjusting mechanism after the assembly of each component part, was separately necessary. Further, after such a focus setting, the fixing operation of the lens frame member, etc., was necessary. Since the movable type focus adjusting mechanism is provided, a resultant structure becomes complicated and there was a tendency that the sensor unit become bulkier.

Further, during the focus setting operation, dirt and dust are liable to intrude into the unit via a clearance at a movable section of the focus setting mechanism and the countermeasure is necessary, such as the focus adjusting operation has to be done in a cleaning room, and a poor production results. The movable type focus adjusting mechanism is liable to suffer a vibration, shock, etc., so that a focus setting position is liable to be deviated. This involves a disadvantage of being poor in product reliability.

JPN PAT APPLN KOKAI PUBLICATION NO. 9-232548 has proposed a solid-state image pick-up device of such a structure as to enable a positional accuracy of a lens relative to a solid-state image pick-up element in an optical axis direction to be secured. The solid-state image pick-up device has one support member with a plurality of positioning sections provided in a stepped fashion. In this case, component parts such as a solid-state image pick-up element, lens member, filter, stop member, etc., are individually separately mounted on the corresponding steps and these members are positioned and fixed. As a result, the dimensional error among the respective steps exerts a greater influence on the positioning accuracy of each member.

Forming these positioning sections in the stepped fashion on the support member offers a difficulty in managing the dimensional accuracy and is liable to introduce an error. Further, a higher degree of production technique is required in forming a plurality of such positioning sections on one support member. In the case where the support member is formed with the use of ceramics material, the manufacture is very difficult and at high costs.

It has been considered that, in most cases, such a support member is manufactured by injection-molding a material such as a synthetic resin.

Even if the support member is manufactured with the use of the injection mold, a resultant product is liable to produce a greater dimensional error among the positioning sections composed of the stepped sections. Further, it has been considered that errors are developed due to the aging and that the product obtained involves a poor reliability.

As set out above, in the conventional solid-state image pick-up device, dimensional errors are liable to be produced among the respective positioning sections and their dimensional control is difficult and no adequate positional accuracy can be secured in the optical axis direction of the lens relative to the image pick-up element. The structure obtained is complicated, poor in productivity, high in manufacturing costs and high in product costs.

BRIEF SUMMARY OF THE INVENTION

It is accordingly the object of the present invention to provide an image pick-up module which improves the mounting accuracy of a lens member relative to a solid-state image pick-up element in an optical axis direction, obviates the need to provide a focus setting adjustment mechanism, is simpler in structure and less in number of component parts involved, improves an assembling operation, size reduction of a product and product reliability, and is low in cost.

In order to achieve the above-mentioned object, the invention of claim 1 is directed to an image pick-up module comprising an image pick-up lens member; a lens frame member retaining the lens member; a semiconductor circuit section having a photoelectric conversion section comprised of two-dimensionally arranged photoelectric conversion element groups, a drive circuit section sequentially driving the photoelectric conversion elements and obtaining a signal charge, an A/D conversion section converting the signal charge to a digital signal, a signal processing section outputting the digital signal as a video signal, light exposure control means electrically controlling a light exposure time based on an output level of the digital signal, the photoelectric conversion section, drive circuit section, A/D conversion section, signal processing section and light exposure control means being formed on the same semiconductor chip; a substrate holding the semiconductor chip 1 and having electrode groups electrically connected to the semiconductor chip;

a frame member for covering which is connected to the substrate and has a hollow structure covering the semiconductor chip; and an infrared ray shutting optical member mounted on the frame member, in which on one surface of the substrate, a positioning reference surface P constituted of an equally flattened surface is defined up to an outer peripheral end of the substrate, the positioning reference surface P includes a semiconductor chip positioning reference surface portion at which the semiconductor chip is joined in a planar way and positioned, a frame member mounting surface portion situated around the semiconductor chip and at which the frame member is joined and mounted, and a lens frame positioning reference surface portion situated outside the frame member and left as a remaining portion at the outer peripheral end portion of the positioning reference surface P and at which the lens frame member is joined upon being mounted and positioned, and in which the semiconductor chip and lens frame member are positioned on the positioning reference surface constituted of the equally flattened surface defined on the one surface of the substrate while using the semiconductor chip positioning reference surface portion and lens frame member positioning reference surface portion.

The invention of claim 2 is directed to an image pick-up module comprising:

an image pickup lens member;

a lens frame member retaining the lens member;

a semiconductor circuit section having a photoelectric conversion section comprised of two-dimensionally arranged photoelectric conversion element groups, a drive circuit section sequentially driving the photoelectric conversion element groups and obtaining a signal charge, and an A/D conversion section converting the signal charge to a digital signal, the photoelectric conversion section, drive circuit section and A/D conversion section being formed on the same semiconductor chip; and a substrate 2 retaining the semiconductor chip and having electrode groups electrically connected to the semiconductor chip, in which, on one surface of the substrate, a positioning reference surface P comprised of an equally flattened surface is defined, the positioning reference surface P includes a semiconductor chip positioning reference surface portion at which the semiconductor chip is joined in a planar way and positioned and a lens frame positioning reference surface portion situated around the semiconductor chip and left as a remaining portion at the outer peripheral end portion of the positioning reference surface P, and at which the lens frame member is joined upon being mounted and positioned, and in which the semiconductor chip and lens frame member are positioned on the positioning reference surface P constituted of the equally flattened surface defined on the one surface of the substrate while using the semiconductor chip positioning reference surface portion and lens frame member positioning reference surface portion.

An image pick-up module of claim 3 incorporates, into a semiconductor circuit section of the image pick-up module of claim 2, a signal processing section outputting the digital signal as a video signal and light exposure control means electrically controlling a light exposure time on the basis of an output level of the digital signal.

An image pick-up module according to claim 4 is characterized in that an optimal member is assembled in an air-tight state in the lens frame member to provide the lens frame member as a hermetic structure and a joined section between the lens frame member and the reference surface is sealed, and the semiconductor chip is sealed with the lens frame member.

An image pick-up module according to claim 5 is characterized in that an optical member, such as an infrared ray shutting member or lens or optical window member is assembled in an air-tight state on the lens frame member to provide a lens frame unit and a joined section between the lens frame unit and the reference surface is sealed in an air-tight fashion and the semiconductor chip is sealed with the lens frame member.

An image pick-up module according to claim 6 is characterized in that a dust-tight transparent member is arranged outside the lens frame member to provide an air-tight structure and a surface joined to the reference surface is sealed and the semiconductor chip is sealed with the lens frame unit.

An image pick-up module according to claim 7 is characterized in that the optical member assembled on the lens frame member recedes to a position more away from the semiconductor chip than an inner wall surface of the lens frame member facing the semiconductor tip and is located within a thickness range of the optical axis direction of the wall section of the lens frame member.

An image pick-up module according to claim 8 is characterized in that the substrate is comprised of a bulk ceramics substrate.

The image pick-up module according to claim 9 in which the positioning reference surface is wholly formed up to an outer peripheral end of the substrate and electrode groups are located at the outer end portion of the substrate.

The image pick-up module according to claim 10 is characterized in that, at one end of the lens frame member facing the positioning reference surface, abutting projections are provided which abut against the positioning reference surface except at the electrode groups of the substrate and recesses are provided in those positions facing the electrode groups and astride and away from the electrode groups.

The image pick-up module according to claim 11 is characterized in that the lens frame member is fitted over the outer periphery of the frame member; at that fitting section between the frame member and the lens frame member, projections are provided at one of the frame member and lens frame member to allow the projections of the one member to be joined to the other member; and the frame member and lens frame member are positioned by the projections and a clearance is formed between the frame member and the lens frame member.

The image pick-up module according to claim 12 is characterized in that the infrared ray shuttering optical member is comprised of a multi-layered type infrared ray elimination filter.

The image pick-up module according to claim 13 is characterized in that a stationary stop aperture is provided at the forward end portion of the lens frame member.

The image pick-up module according to claim 14 is characterized in that, at the forward end portion of the lens frame member, a cylindrical wall is provided around the stop aperture.

The image pick-up module according to claim 15 is characterized in that a protective coating film is coated on the electrode groups at least at these portions where other members are joined.

The image pick-up module according to claim 16 is characterized in that the electrode groups are provided at the positioning reference surface of the substrate except at an area where the electrode groups are joined.

The image pick-up module according to claim 17 is characterized in that no coating is made at that area of the electrode groups corresponding to the recess.

According to the invention according to claims 1 to 3, the mounting positions of the semiconductor chip and lens frame member are determined on the positioning reference surface of an equally flattened surface defined on one surface of the substrate and it is possible to enhance the positional accuracy of both while adopting a simpler structure. The positioning is completed unconditionally by assembling the semiconductor chip and lens frame member on the same substrate. And the post-assembling focus setting is not necessary and it is possible to make an assembly in a simpler and readier way. Since the positioning accuracy of both the semiconductor chip and lens frame member are enhanced, it is not necessary to provide a focus-setting movable adjusting mechanism which would be required in the prior art. The resultant structure is less in the number of component parts required, compact, lightweight, lower in costs, etc. Further, it is possible to prevent the generation of an error resulting from the movable adjusting mechanism as well as a lowering of reliability. It is also possible to enhance the resistance to vibration. Further, the image pick-up module obtained is simple and high in air-tightness and it can be used even under a severe environment of use.

In the present invention according to claim 2, the semiconductor circuit section formed on the semiconductor chip includes an A/D conversion section for converting a signal charge which is obtained from the photoelectric conversion section to a digital signal and the electric image pick-up processing is completed. According to claims 1, 3, the semiconductor circuit section formed on the semiconductor chip includes an A/D conversion section for converting a signal charge which is obtained from the photoelectric conversion section to a digital signal and a light exposure control means for electrically controlling a light exposure time on the basis of an output level of the digital signal. Even if any mechanical stop mechanism is not incorporated for light amount control, an image pick-up function is completed and the mirror body of the image pick-up module is made simple and lightweight.

In the invention according to claims 2, 3, 4, 5, 6, 7, it is possible to, without providing any frame member, obtain a simple structure less in the number of component parts required, hermetically seal the semiconductor chip and secure product reliability. Further, by reducing the component parts required, the structure can be made lightweight, smaller in size and lower in manufacturing costs. Further, since the lens frame member is utilized as a hermetically sealed member, a sealing-only member is not required and a larger semiconductor chip can be held within a restricted space and a compact size can be obtained. Further, since the infrared ray cut filter, etc., arranged at the forward end side of the optical system is also used as a sealing member, it is equipped with a water-tight function.

Further, in the image pickup module according to claim 7, the optical member assembled on the lens frame member is arranged in a thickness range of the wall section of the lens frame member, thus obtaining a compact unit.

In the invention according to claim 8, the positioning reference surface is obtained with high accuracy and the image pick-up module can be manufactured at low costs.

According to the present invention of claim 9, the electrode groups can be rationally arranged on a single substrate.

According to the present invention of claim 10, the lens frame member does not hit directly against the electrode groups provided on the substrate. And the electrode group is protected and the positioning of the lens frame member is secured. Upon soldering, heat exerts a minimally possible small influence on the lens frame member.

According to the invention of claim 11, the positioning accuracy of the lens frame member relative to the frame member is enhanced and the fixing of both is positively secured and, upon soldering, heat exerts a minimally possible low influence on the lens frame member. Further, for example, the lens frame member can be bonded to the frame member through the utilization of the clearance.

According to the invention of claim 12, reliability is improved in terms of an optical function.

According to the invention of claim 13, the positioning accuracy of the lens frame member relative to the semiconductor chip is high and, as the stop, a stationary stop aperture well serves that purpose. This stop structure is simpler and smaller in size. Since, in particular, the "stop" section is provided at the forward end side of the image pick-up structure, a simpler mold, etc., can be used and a protective function, etc., can be obtained at the forward end side of the lens.

According to the invention of claim 14, it is possible to prevent a damage to the stop aperture.

According to the invention of claim 15, any inconvenience, such as the electric short-circuiting, resulting from the joining of the electrode groups can be avoided.

According to the invention of claim 16, the inconvenience of joining the electrode groups to the lens frame member is avoided and the positing accuracy of the lens frame member can be secured.

According to the invention of claim 17, no coating is required at the area of the electrode groups, so that it is possible to simplify the structure and to improve the productivity.

BRIEF DESCRIPTION OF THE SEVERAL VIEWS OF THE DRAWING

FIG. 3A is a top-side view showing a ceramics substrate of the image pick-up module;

FIG. 3B is a view as seen from a direction of an arrow along line IIIB—IIIB in FIG. 3A; and FIG. 3C is a bottom view showing the ceramics substrate;

DETAILED DESCRIPTION OF THE INVENTION

Figure 1:
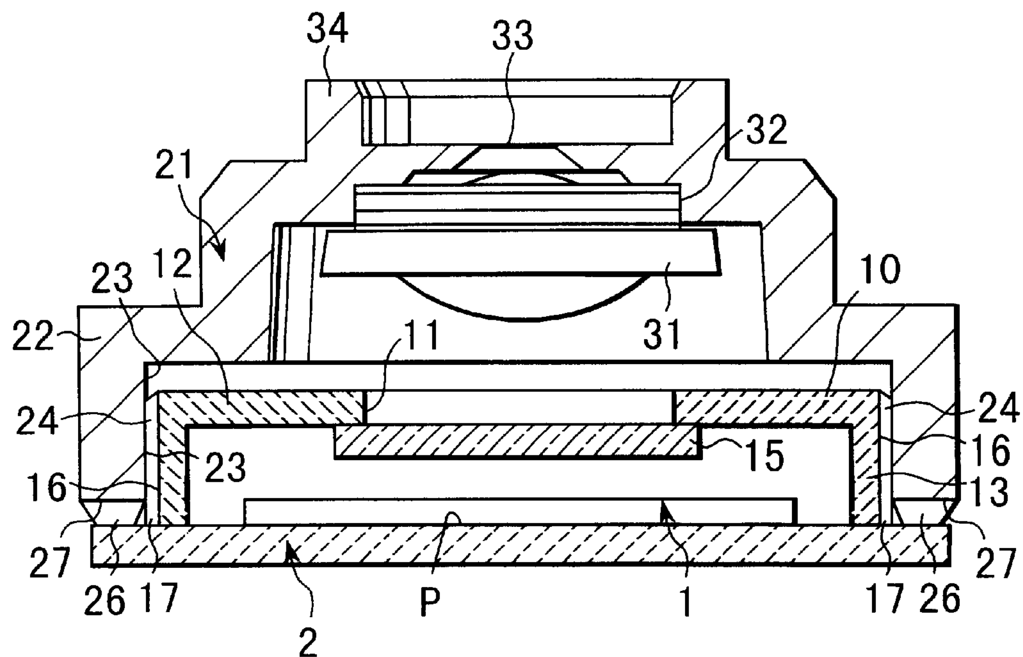
FIG. 1 is a view in longitudinal cross-section showing an image pick-up module according to one embodiment of the present invention.
Figure 2:
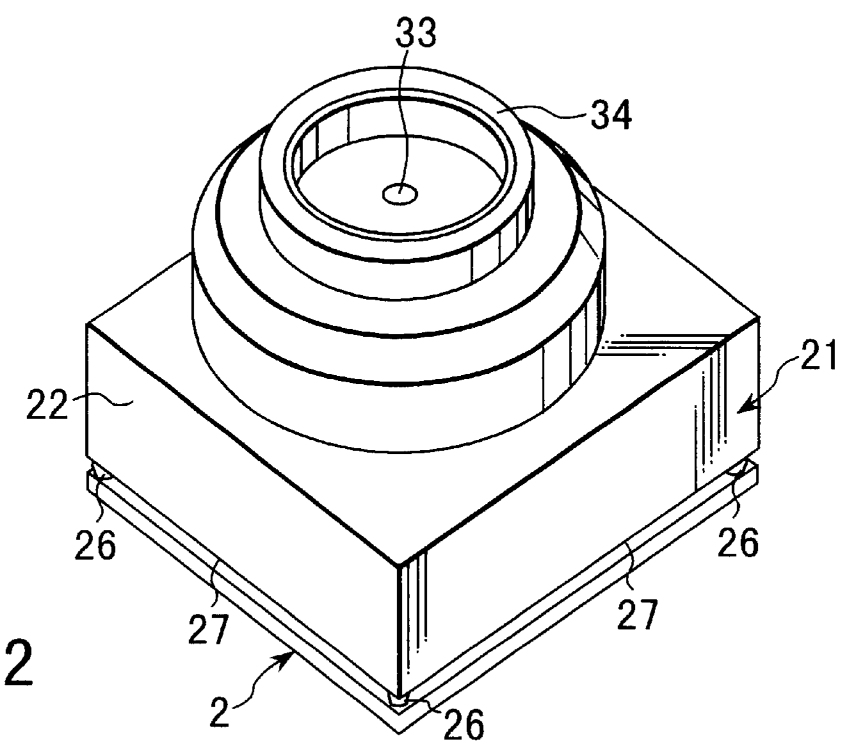
FIG. 2 is a perspective view as seen from a front-side perspective position of the image pick-up module.

One embodiment of the invention will be explained below with reference to FIGS. 1 to 6. FIG. 1 is a vertical cross-sectional view showing an image pick-up module according to the present invention. FIG. 2 is a perspective view as seen from a front surface side of the image pick-up module.

In FIGS. 1 and 2, reference numeral 1 shows a semiconductor chip of one-chip type. The semiconductor chip 1 is so mounted as to be bonded to an upper surface of a substrate, for example, a hard bulk-type ceramics substrate 2. The ceramics substrate 2 is prepared by baking an integral bulk material and forming it as a rectangular sheet-like member of a uniform thickness as shown in FIGS. 3A, 3B and 3C. The upper surface of this bulk type ceramics substrate 2 is so formed as to have a uniform flat surface. This uniform flat surface provides a reference surface P on the basis of which other mount component parts are positioned (see FIG. 1).

The ceramics substrate 2 is manufactured as follows. That is, the ceramics substrate 2 is formed by pushing component materials of the ceramics against a mold of high flatness to a shaped integral bulk mass and baking it. Further, one surface of the thus shaped/baked ceramics substrate 2 is utilized directly as a reference surface P.

The center area of the positional reference surface P provides a semiconductor chip positioning reference area where the semiconductor chip 1 is bonded and positioned. The above-mentioned semiconductor chip 1 is so mounted as to be set at a chip positioning reference area by, for example, bonding. Further, at the above-mentioned positioning reference surface P a remaining area defined by an unoccupied area around the semiconductor chip 1 provides a positioning area where a frame member and lens frame member as will be set out below are joined.

Further, signal inputting/outputting electrode groups 3 are attached to four-side outer peripheral end portions of the ceramics substrate 2 and electrically connected to the above-mentioned semiconductor chip 1. The electrode groups 3 are arranged at the outer peripheral end portions of the respective sides of the ceramics substrate 2 with four corner portions of the ceramics substrate 2 left. Respective lead terminals 4 of the electrode groups 3 are so arranged as to extend around onto the outer edge portions of the lower surface of the ceramics substrate 2 as shown in FIG. 3C.

When the image pick-up module is mounted on a device, etc., the lead terminals of the device are connected to the lead terminals 4 by soldering, etc.

In accordance with the mounting state, etc., of the semiconductor chip 1, the electrode groups 3 may be made to other forms or mixed forms.

As shown in FIG. 1, a hollow frame member (intermediate member) 10 made of ceramics is arranged above the above-mentioned ceramics substrate 2 to cover the above-mentioned semiconductor chip 1. The frame member 10 serves also as a cover for protecting the semiconductor chip 1 from dust, moisture, etc.

Figure 4A:
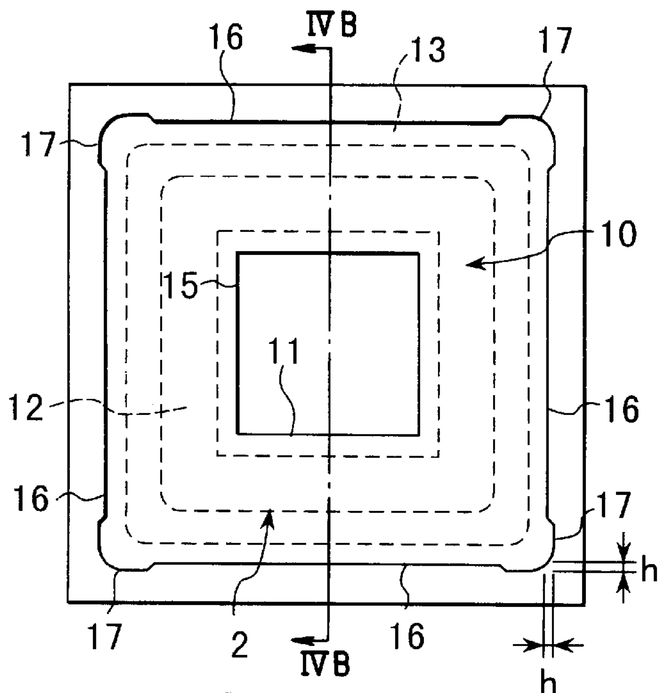
FIG. 4A is a top-side view showing a combination of a frame member and ceramics substrate in the image pick-up module.
Figure 4B:
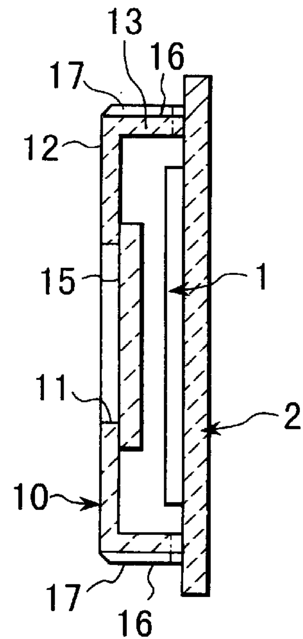
FIG. 4B is a view in longitudinal cross-section as taken along line IVB—IVB in FIG. 4A, showing the combination of the frame member and ceramics substrate in the image pick-up module.

The frame member 10 for covering has a flat plate-like top plate section 12 having a through hole 11 at its center area and a circumferential wall section 13 of a rectangular cylinder as shown in FIGS. 4A and 4B and, as seen generally, is formed as a rectangular box-like configuration. The through hole 11 is hermetically sealed by a transparent member. For example, the through hole 11 is blocked by covering the through hole 11 with, for example, a multi-layered type infrared ray shutting member 15. The semiconductor chip 1 on the ceramic substrate 2 is hermetically covered by the frame member 10 thus structured and, by doing so, the semiconductor chip 1 is sealed.

A lower end edge of the circumferential wall section 13 of the frame member 10 for covering is positioned by abutting it against a frame member mounting surface portion utilizing a portion of the positioning reference surface P defined by the upper surface of the ceramics substrate 2 and is fixed by hermetically bonding it to that surface portion. Since the end edge of the circumferential wall section 13 is so positioned as to be abutted against the upper surface of the ceramics substrate 2, high mounting accuracy is obtained in an optical-axis direction (x direction) with respect to the mounting reference surface P of the ceramics substrate 2.

In order to avoid the electrode groups 3, those end edge portions corresponding to the areas of the electrode groups 3 may be so cut as to provide a recess astride the area of the electrode group 3 (see FIG. 4B).

The frame member 10 is prepared by baking a bulk type ceramics component material. At this time, the outer surface of the cylindrical wall section 13 of the frame member 10 is formed to have a flat outer surface 16. A lens frame member 21 as will be set out below is fitted over the outer surface of the frame member 10. Although the above-mentioned frame member 10 is made of a ceramics bulk, it may be made of a plastics shaped product.

On the other hand, the above-mentioned mirror member 21 is formed of, for example, a member made of a metal. The circumferential wall section 22 corresponds to a dimensional configuration of the circumferential wall section 13 of the above-mentioned frame member 10 and has a rectangular cylinder with four flat inner surface portions 23. The lens frame member 21 may be formed of a member made of a resin.

Figure 5A:
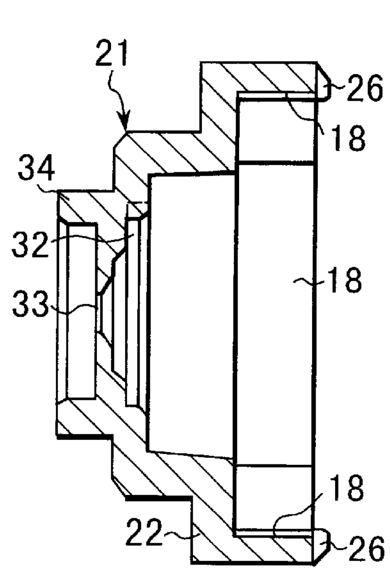
FIG. 5A is a view in longitudinal cross-section showing a lens frame member of the image pick-up module.
Figure 5B:
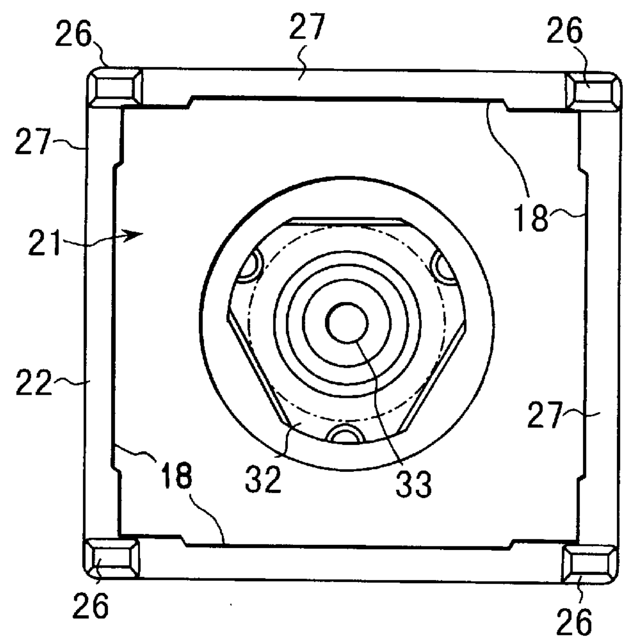
FIG. 5B is a bottom view showing a lens frame member in the image pick-up module.

In the respective inner surface portions corresponding to that outer circumference of the frame member 10 over which the circumferential wall section 22 of the lens frame member 21 is fitted, a recess 18 of a small depth is formed as a cutout at an intermediate (middle) section except at later-described bulged portions 17 (see FIGS. 5A and 5B). At the outer surface of the frame member 10, the recess faces a portion of the outer surface 16 except at the bulged sections 17 to provide a clearance 24 therebetween.

As shown in FIGS. 1 and 2, the lens frame member 21 and ceramics substrate 2 are so formed that their four-side end edge portions have an equal size.

At the outer circumference of the frame member 10 at four corners, the bulged portions 17 are provided. The bulged portions 17 are somewhat highly projected in either case at the adjacent two outer surface sections as shown in FIG. 4A and are equally formed to have a height h. And when the lens frame member 21 is fitted over the outer circumference of the frame member 10, the bulged portions 17 only are latchingly joined at the four corner areas of the inner surface 23 of the lens frame member 21, so that positioning is done in xy directions of the lens frame members 21 with respect to the frame member 10. For this reason, the positioning accuracy of the xy direction of the lens frame member 21 is determined by the accuracy of the bulged portions 17 only. If, therefore, the bulged portions 17 only are formed with high accuracy, it is not necessary to form other sections more accurately.

When the lens frame member 21 is fitted over the outer circumference of the frame member 10, the clearance 24 corresponding to the height h of the bulged portion 17 is created between the flat outer surface 16 of the frame member 10 and the flat inner surface 23 of the lens frame member 21. By flowing a bonding agent into the clearance 24 the lens frame member 21 is joined to the frame member 10 and both are fixedly mounted.

As a method for flowing the bonding agent, it is usual practice to flow it through the recess 27 between projections 26 of the lens frame member 21 as will be set out below. By forming a flowing hole (not shown) in the circumferential wall section 22 of the lens frame member 21 a bonding agent may be flowed into the clearance 24.

Projections (not shown) may be individually formed at the outer surface portions 16 of the frame member 10 instead of the bulged portions. It is desirable to form the projection integrally at the corner of both ends of the respective outer surface portions in a way to correspond to the bulged portions. Further, the bulged portions 17 and projections may be provided on the lens frame member 21 side instead of on the frame member 10 side. Even in this case, it is possible to obtain the same positional function and clearance creating function. The bulged portions 17 and projections act as the positioning means and clearance creating means of the frame member 10 and lens frame member 21.

The positioning is achieved relative to an optical axis (z) direction of the lens frame member 21 by abutting the end edge of the circumference wall section 22 of the lens frame member 21 against the positioning reference surface P defined on the upper surface of the ceramics substrate 2. As shown in FIG. 1, an area where the end edge of the circumferential wall section 22 of the mirror frame member 21 abuts against the upper surface of the ceramics substrate 2 is a portion in the positioning reference surface P which is left around the outer circumference of the frame member, that is, an area which is left as a remaining surrounding area after other members have been arranged.

Here, the remaining surrounding area of the positioning reference surface P of the ceramics substrate 2 provides a mounting reference portion of the lens frame member 21. The mounting reference portion of the lens frame member 21 is positioned on a portion of the positioning reference surface P defining the same flat surface as that on which the above-mentioned other component parts (members), such as the semiconductor chip 1, are mounted. And both members are positioned in an optical axis direction on the common positioning reference surface P.

Here, in order to prevent the abutting of the end edge of the circumferential wall section 22 of the lens frame member 21 against the electrode groups 3 arranged at the respective sides of the ceramics substrate 2 in particular, abutting projections 26 are integrally provided at four corners of the end edge of the circumferential wall section 22 of the lens frame member 21, so that only these four projections 26 are abutted against the positioning reference surface P of the ceramics substrate 2. Thus, on the upper surface of the ceramics substrate 2, those abutting areas 28 abutting against the four projections 26 of the lens frame member 21 are restricted at those spaces at the four corners of the positioning reference surface P as shown in FIG. 3A.

By the projections 26 formed at both ends of the respective sides of the lens frame member, the intermediate section of the respective end edge portions of the circumferential wall section 22 provides a recess 27 astride the electrode group 3 at each side of the ceramics substrate 2. The recess 27 recedes from the electrode group 3 at each side of the ceramics substrate 2, thus preventing an intervention, that is, a direct abutting of the lens frame member 21 against the electrode group 3.

Further, since only the abutting projection 26 provided at the corners of the end edge of the circumferential wall surface 22 is set in abutting contact with the upper surface of the ceramics substrate 2, the portions of the projections 26 are formed with high precision in particular and, by doing so, it is possible to improve the accuracy with which the lens frame member 21 is mounted on the positioning reference surface P. When the lens frame member 21 is bonded/fixed to the frame member 10, a bonding agent can be flowed into the clearance 24 via the recess 27 defined between the projections 26.

At the area with the electrode group 3 arranged, a protective coating 29 made of an electrical insulating material, such as alumina, is provided over the ceramics substrate 2. It is desirable that the protective coating 29 be provided except at the abutting areas 28 against which the four projections 26 of the lens frame member 21 are abutted. Further, it is sufficient to provide the protective coating 29 at the area corresponding to at least the frame member 10. It may be possible, however, to provide it at an area including the lens frame member 21.

A support section 32 is provided at the lens frame member 21 to retain an optical member of an optical system, such as a lens member 31, in place. The lens member 31 is retained at the support section 32 such that it is situated at a predetermined distance from the forward end of the projection 26. A stationary stop aperture 33 is provided such that it is situated at a more forward position than the lens member 31 and at a center of the forwardmost end wall of the lens frame member 21. A cylindrical wall-like hood 34 is provided at the forwardmost end face side of the lens frame member 21 and concentrically extends as a flange around the stop aperture 33. The hood 34 prevents something from being inadvertently hit at the stop aperture 33 and hence the stop aperture from being deformed.

Figure 6:
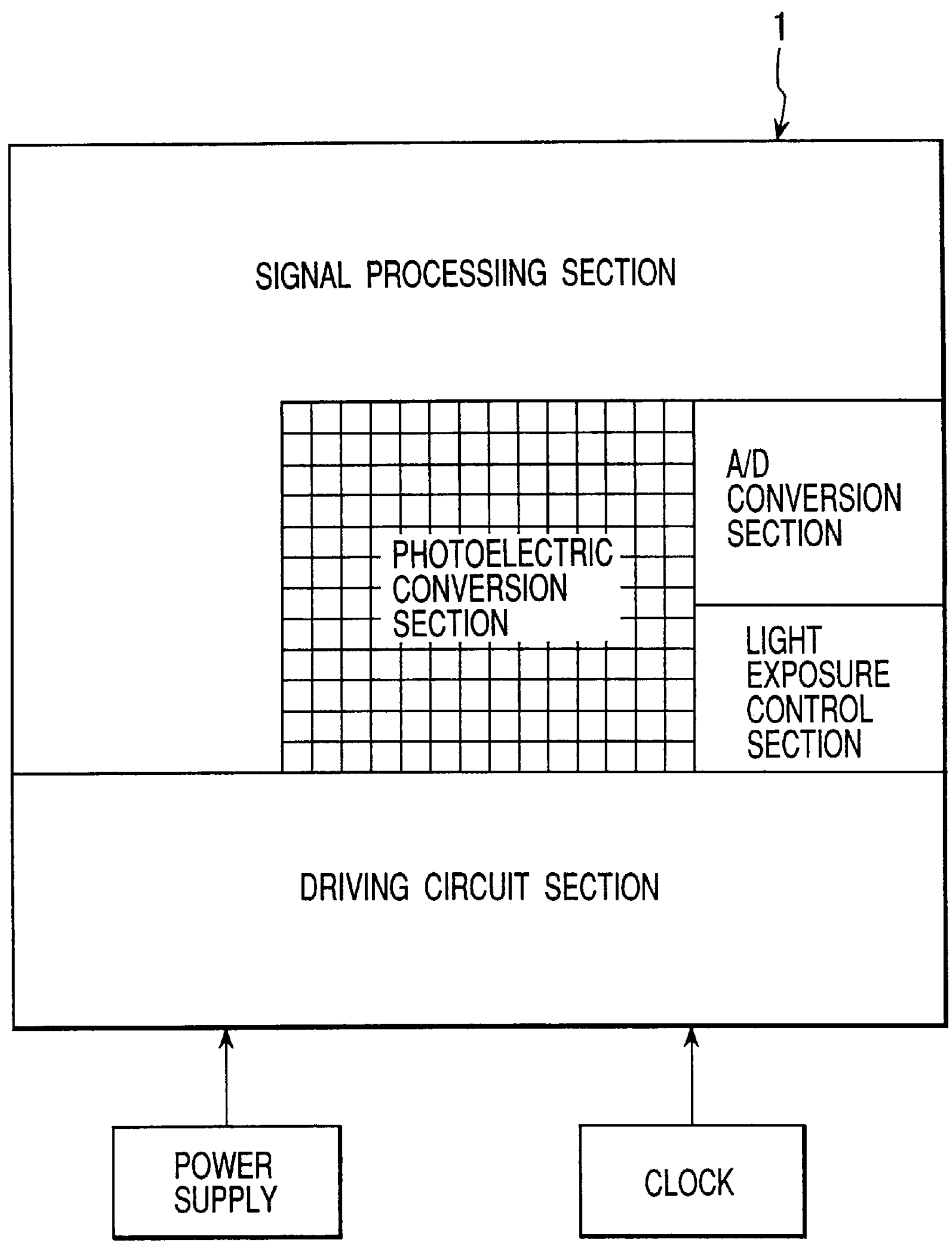
FIG. 6 is an explanatory view showing an array structure of a MOS type semiconductor chip in the image pick-up module.

On the other hand, a sensor is mounted at the upper surface (positioning reference surface P) of the ceramics substrate 2 and comprised of a single CMOS type semiconductor chip 1. A plurality of electronic circuits are provided in the CMOS type semiconductor chip 1. FIG. 6 shows one example of its electronic layout structure. At the light receiving section provided at the central section of the semiconductor chip 1, a photoelectric conversion section is provided which comprises a two-dimensional array of photo-electric conversion groups. The height of the light receiving surface of the photoelectric conversion section as viewed from its lower surface bonded to the positioning reference surface P of the ceramics substrate 2 is accurately defined. Around the photoelectric conversion section, a drive circuit section, A/D conversion section for converting an analog signal to a digital signal, signal processing section and light exposure control section are integrally provided as peripheral circuits. A power supply and clock are fed from an external circuit, not shown, to the semiconductor chip 1. As the clock, use is made of a clock for a dedicated image-pickup system and a system clock applied to that purpose. Further, a digital or analog video signal is output from the semiconductor chip 1.

The drive circuit section sequentially drives the photoelectric conversion element groups of a photoelectric conversion section in a horizontal and a vertical direction and a read-out signal charge is supplied as a time sequential signal to the A/D conversion section. The A/D conversion section converts the signal charge to an 8- or 10-bit digital signal and outputs the digital signal to the signal processing section. Further, the signal processing section converts the digital signal to an ordinary video signal and is output to an outside.

The ordinary video signal, being a digital signal for instance, is output as Y, $C_B$ and $C_R$ component signals in a 4:2:2 format. Further, if the video signal is comprised of an analog signal, it is digital-encorded to one for the NTSC or the PAL system. And the signal is passed through the D/A conversion circuit in the signal processing section and output as the analog video signal to an outside.

On the other hand, a digital signal is supplied from the A/D conversion section to a light exposure control section serving as a light exposure control means.

In the light exposure control section, an optimal electric shutter speed is calculated through a digital integration circuit and calculation means, not shown, and, by varying a set value of an electric shutter speed, a light exposure level is controlled upon taking a picture. The electric shutter speed can be set to one part in tens of thousands of seconds and any mechanism for varying a stop value for light level control is not necessary. That is, this completes an image pick-up function even if any mechanical stop mechanism for light control is not incorporated into the image pick-up module. Further, the D/A conversion output may be delivered directly to an outside.

In this embodiment, as set out above, both the mounting reference surface in the optical axis direction of the light receiving surface of the semiconductor chip 1 and the mounting reference surface in the optical axis direction of the lens frame member 21 with the lens member 31 retained there are defined on the positioning reference surface P of a common flat surface at one surface side of the same ceramics substrate. Since both are positioned through the utilization of the same positioning reference surface P, a resultant structure, being simpler, can enhance the positioning accuracy of the light receiving surface of the semiconductor chip 1 and lens member 31 of the lens frame member 21.

Since the distance between the light receiving surface of the semiconductor chip 1 and the lens member 31 can be accurately decided, it is not necessary to provide any movable adjustment mechanism for focal setting which would otherwise be required in the conventional counterpart. A resultant structure is less in the number of component parts required, smaller in size, lighter in weight and lower in cost.

Further, unconditional accurate positioning is completed by assembling the semiconductor chip 1 and lens frame member 21 on the same ceramics substrate 2. Thus no focal setting is necessary after assembly and simpler and readier assembly can be achieved.

Further, the resultant image pick-up module can prevent occurrence of an error resulting from the movable adjustment mechanism for focal setting which would otherwise be involved in the conventional counterparts. In addition, it is also possible to improve the resistance to the vibration of the resultant unit. And it is possible to obtain an image-pickup module of a simple and high-sealing structure and to use it safely even in a severe environment.

Further, the ceramics substrate 2 may be of a laminate type, but, here, it is of a unitary bulk type. This bulk type substrate is prepared by, before baking the ceramics material, compressing a bulk material in a mold of high flatness to a shaped mass and baking it. For this reason, the post-baked configuration is high in accuracy and hence, without any polishing process after baking, its one surface can be used directly as the positioning reference surface P. For this reason, a simpler, low-cost structure can be obtained and post-baked configuration accuracy is better even in comparison with the laminate type formed by stacking ceramics sheets usually often utilized for a semiconductor package. Thus improved accuracy is achieved.

Generally, any complicated configuration, being made of plastics, may be highly accurately manufactured as a whole, while, on the other hand, such a configuration, being made of ceramics, requires a high degree of a manufacturing technique and a high cost. Here, only one surface of the ceramics substrate 2 has to be manufactured with high accuracy and it has an advantage of being formed at low costs. The same thing is true of the frame member and, in this case, the frame member may be highly accurately formed only at the bulged portions.

Since the ceramics substrate 2 is prepared by forming the bulk material to a shaped integral mass and baking it, a post-baked configuration accuracy is high and, without any polishing process, a flattened surface formed on one surface side of the ceramics substrate can be utilized as a highly accurate positioning reference surface P.

At the area where the electrode groups 3 of the ceramics substrate 2 are arranged, the protective coating 29 is provided at a portion at least corresponding to the frame member 10 and lens frame member 21. As a result, the electrode group 3 can be prevented from being electrically short-circuiting by the frame member-to-lens frame member bonding or the coating of the bonding agent, etc.

By the projections 26 formed at the end edge portions of the circumferential wall section 22 of the lens frame member 21, the recess 27 is formed at the intermediate section at these end edge portions. The recess 27 is situated astride the electrode group 3 of the ceramics substrate and recedes away from the electrode group 3, so that it can be prevented from being contacted with the lens frame member 21. Since there is no direct bond between the electrode group 3 and the lens frame member 21, there is no direct heat transmission to the lens frame member 21 past an associated electrical conductor pattern when a soldering is made to the electrode group 3. For this reason, the lens frame member 21 is prevented from being deformed by heat and the mounting accuracy of the lens frame member 21 is secured.

Since, at an area where the electrode group 3 is arranged over the ceramics substrate 2, the protective coating 29 of an electrically insulating material, such as alumina, is provided, when the lens frame member 21 is fixedly joined to the frame member 10, it is possible to protect the electrode group 3 and to prevent an electrode-to-electrode short-circuiting. In the case where the recess 27 is formed at the lens frame member 21 in a manner to be astride the electrode group 3, it may obviate the necessity to provide the protective coating 29. Further, even if the protective coating 29 is provided, the electrode group 3 is placed under an enhanced protective function.

The present invention is not restricted to the above-mentioned embodiment and various changes or modifications of the present invention can be made without departing from the spirit and scope of the present invention. Although the semiconductor chip 1 in the present embodiment is comprised of a single CMOS type semiconductor chip, an optical sensor may be used which comprises a CCD image-pickup element chip with its light receiving section and peripheral circuits, such as an analog output circuit, memory circuit, clock circuit and dynamic enlarging section. Although the projections 26 of the lens frame member 21 and corresponding abutting areas 28 at the positioning reference surface P are in four sets, that is, are located at the four corners of the ceramics substrate 2, they may be provided at other locations and in three sets instead of the four sets. Although the semiconductor chip 1 and lens frame member 21 may be arranged with respect to the center of the ceramics substrate 2, they may be arranged in an offset way on the ceramics substrate 2. Further, the image pick-up module may be fitted into a terminal socket with the electrode group 3 connected to another device. Although, in the above-mentioned embodiment, the lens frame member 21 and frame member 10 are bonded to the ceramics substrate 2, they may be fixed there by other means, such as a fixing means. If the positioning reference surface section of the lens frame member 21 is secured relative to the positioning reference surface P of the ceramics substrate 2, a package structure may be adopted in which the ceramics structure 2 is located within another outer wall portion of the lens frame member 21 in a surrounding way.

With reference to FIGS. 7 to 10, a modification of the image pick-up module according to the above-mentioned embodiment will be explained below.

Figure 7:
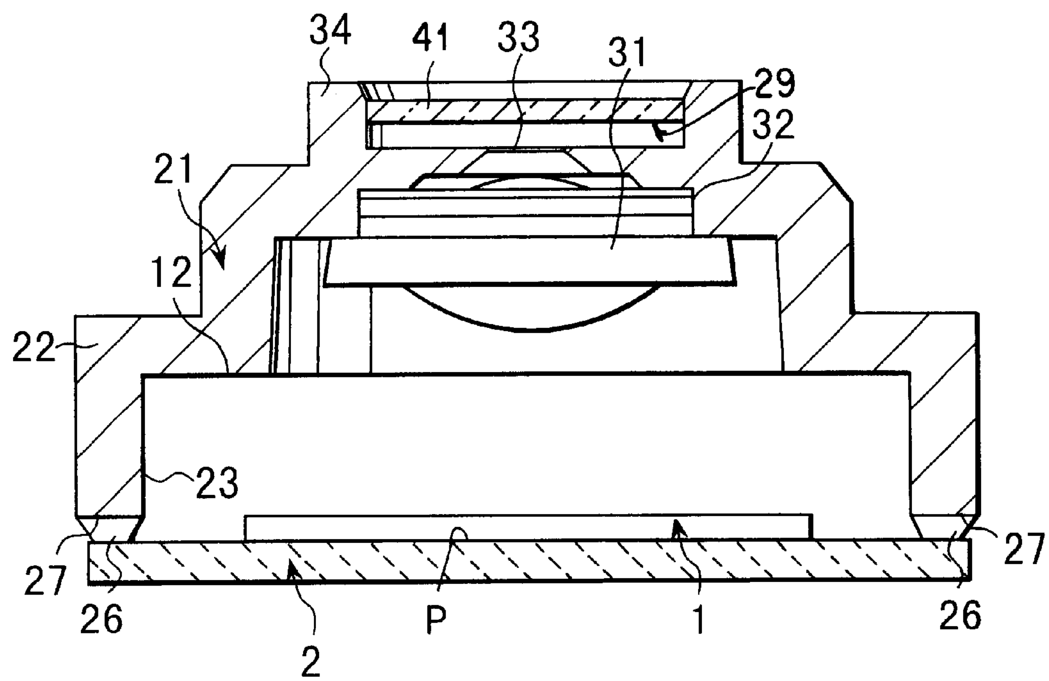
FIG. 7 is a view in longitudinal view showing an image pick-up module of a first modification of the embodiment of the present embodiment.

In the structure of the above-mentioned image pick-up module of a first modification shown in FIG. 7, the frame member 10 for covering is omitted and a transparent dust-tight protective member 41 is provided at a forwardmost end of a lens frame member 21 and comprised of an optical member, such as protective glass or infrared ray cut filter (infrared ray shutting member) and a stop aperture 33 is closed by the dust-tight protective member 41 in an air-tight fashion. The protective member 41 is located within a cylindrical hood 34 projecting at the forwardmost end face of the lens frame member 21 and adhesively bonded in the air-tight fashion. And the stop aperture 33 is located in front of a lens member 31 and sealed by the protective member 41 in an air-tight fashion. Further, the end edge of a circumferential wall section 22 of the lens frame member 21 is sealed to an upper surface of the ceramics substrate 2. A seal is achieved, by a sealing member such as a sealing agent, between the circumferential wall section 22 of the lens frame member 21 and the upper surface of the ceramics substrate 2.

In the first modification, the lens frame member 21 provides an air-tight structure with an optical member assembled to the lens frame member 21 in an air-tight way. Sealing is achieved between the lens frame member 21 and the reference surface and the semiconductor chip 1 is hermetically sealed with the lens frame member 21. That is, the lens frame member 21 constitutes a hermetic cover member and covers the semiconductor chip 1 in a hermetically sealing fashion. For this reason, the semiconductor chip 1 is hermetically sealed, in a simpler structure, with less component parts, thus ensuring a hermetic seal and its reliability. Less component parts ensures a compact, lightweight and low-cost unit.

If, as a sensor, an exposure control circuit and light measuring circuit or a system interface, etc., are formed on the semiconductor chip, the semiconductor chip becomes bulkier with a consequent bulkier package. Since, in the first modification, the lens frame member 21 is utilized as a hermetic sealing member, no other sealing-only member is necessary and a greater semiconductor chip can be held in a restricted space, so that a small unit can be obtained as a product. Further, the infrared ray cut filter, etc., set on the front-end side of the optical system is used also as a sealing member and it can be equipped with a water-proof function. The infrared ray cut filter set on the front-end side of the optical system acts also as a protective glass and an injury to a lens, etc., due to the intrusion of dirt and dust never occurs.

Figure 8:
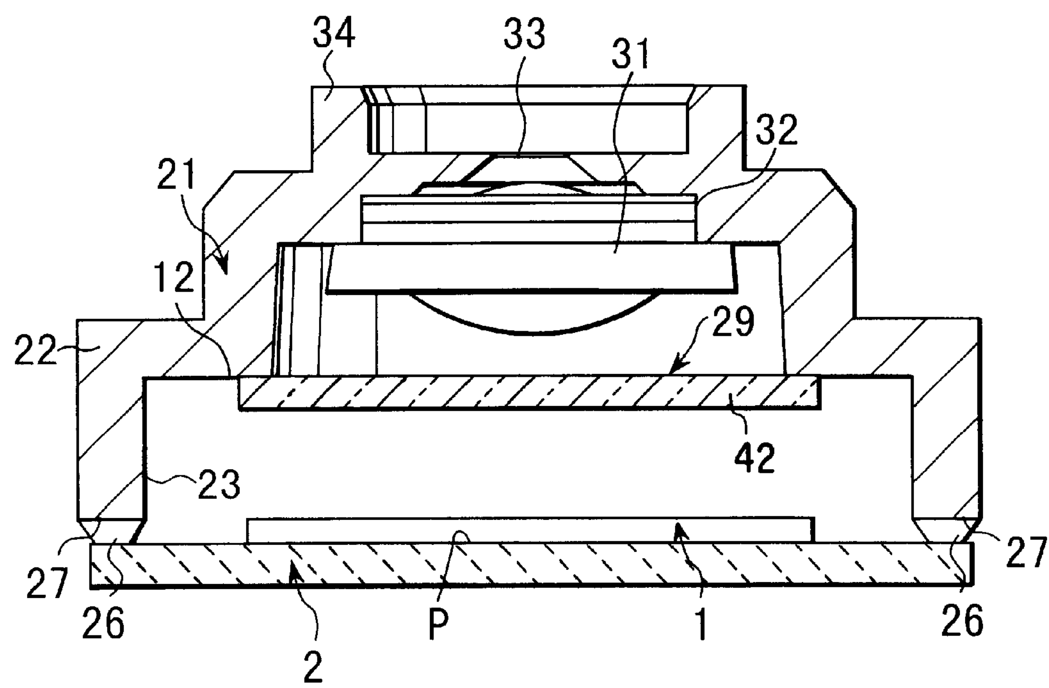
FIG. 8 is a view in longitudinal cross-section showing a second modification of the embodiment of the present embodiment.

FIG. 8 shows a second modification and, like the first modification, a transparent protective member 42 such as protective glass or infrared ray cut filter is located at an inner wall surface inside a lens frame member 21 to provide an air-tight structure, noting that a frame member 10 for covering which is used in an image pock-up module of the above-mentioned embodiment is omitted. The circumferential wall section of the lens frame member 21, as in the first modification, is mounted in an air-tight fashion on the upper surface of a ceramics substrate 2.

Figure 9:
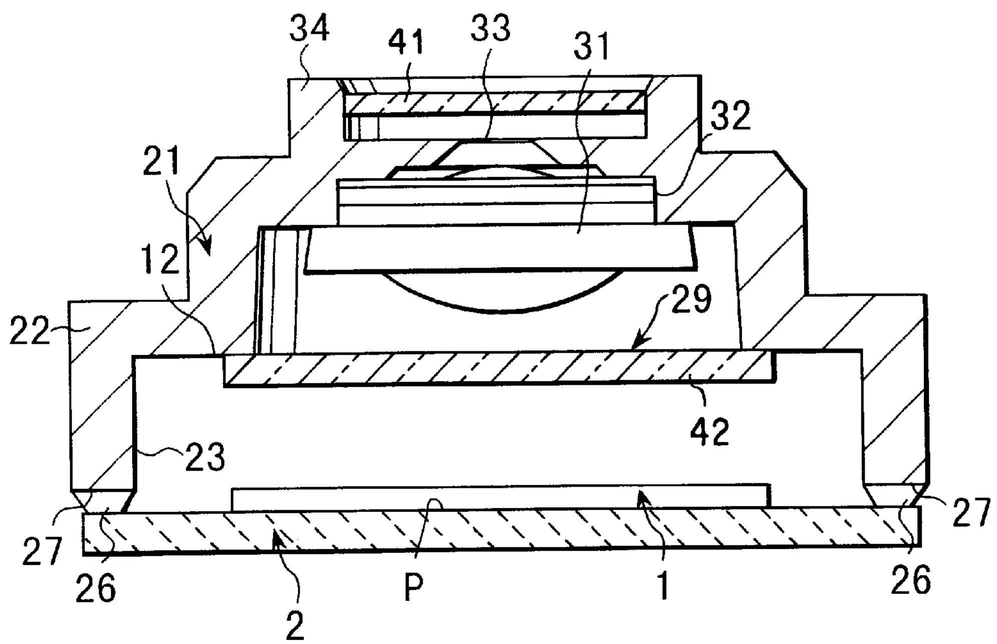
FIG. 9 is a view in longitudinal cross-section showing a third modification of the embodiment of the present embodiment.

A third modification shown in FIG. 9 provides a structure combining the air-tight sealing structure of the first modification and air-tight sealing structure of the second modification. By this combination structure, not only a lens member 31 and stop aperture 33 but also an optical member 42 can be protected.

Figure 10:
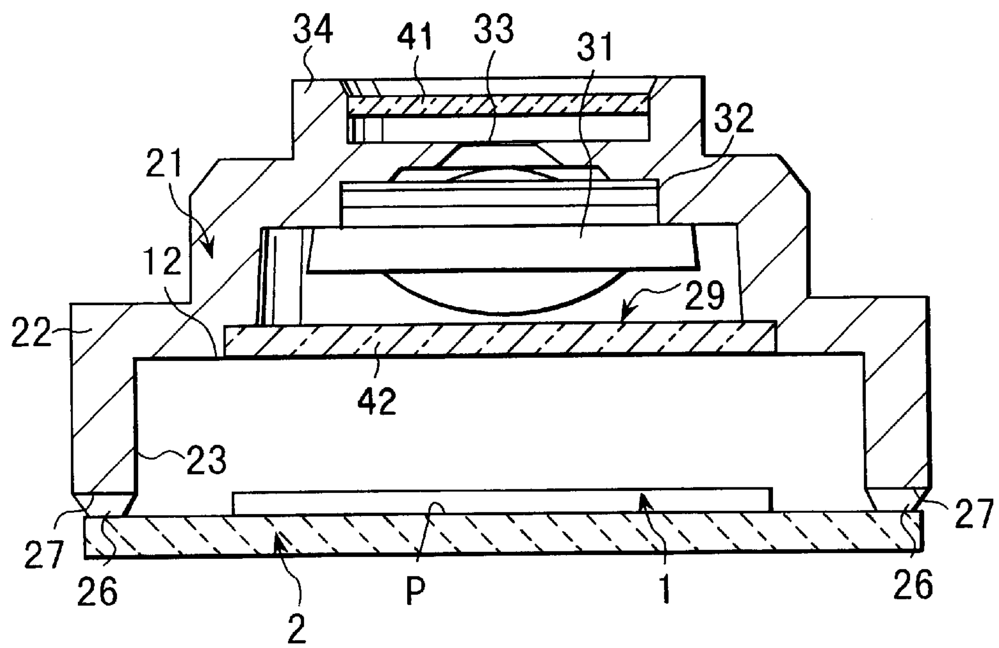
FIG. 10 is a view in longitudinal cross-section showing a fourth modification of the embodiment of the present embodiment.

In a fourth modification shown in FIG. 10, an inside protective member 42 of the third modification is so provided as to be buried in a wall portion of a lens frame member 21, so that it is not projected from an inside end face of the lens frame member 21. That is, an inside protective member 42 serving as an optical member assembled on the lens frame member 21 recedes to a position further away from the semiconductor chip 1 than an inner wall surface of the lens frame member 21 and it is arranged within a thickness range defined in an optical axis direction of the wall section of the lens frame member 21.

Since, in the fourth modification, the protective member 42 is arranged as the optical member within a thickness range of the wall section of the above-mentioned lens frame member 21, it is possible to provide an adequate space between the semiconductor chip 1 and the protective member 42.

It is to be noted that, as explained in conjunction with the above-mentioned embodiment, in addition to the hermetic air-tight sealing structure utilizing the frame member 10, another hermetic air-tight sealing structure may be provided utilizing the above-mentioned lens frame member 21.

What is claimed is:

1. An image pick-up module comprising;

an image pick-up lens member;

a lens frame member retaining the lens member;

a semiconductor circuit section having a photoelectric conversion section comprised of two-dimensionally arranged photoelectric conversion element groups, a drive circuit section sequentially driving the photoelectric conversion elements and obtaining a signal charge, an A/D conversion section converting the signal charge to a digital signal, a signal processing section outputting the digital signal as a video signal, light exposure control means electrically controlling a light exposure time based on an output level of the digital signal, the photoelectric conversion section, drive circuit section, A/D conversion section, signal processing section and light exposure control means being formed on the same semiconductor chip;

a substrate holding the semiconductor chip and having electrode groups electrically connected to the semiconductor chip;

a frame member for covering which is connected to the substrate and as a hollow structure covering the semiconductor chip; and an infrared ray shutting optical member mounted on the frame member, in which on one surface of the substrate, a positioning reference surface constituted of an equally flattened surface is defined up to an outer peripheral end of the substrate, the positioning reference surface includes a semiconductor chip positioning reference surface portion at which the semiconductor chip is joined in a planar way and positioned, a frame member mounting surface portion situated around the semiconductor chip and at which the frame member is joined and mounted, and a lens frame positioning reference surface portion situated outside the frame member and left as a remaining portion at the outer peripheral end portion of the positioning reference surface and at which the lens frame member is joined upon being mounted and positioned, and in which the semiconductor chip and lens frame member are positioned on the positioning reference surface constituted of the equally flattened surface defined on the one surface of the substrate while using the semiconductor chip positioning reference surface portion and lens frame member positioning reference surface portion.

2. An image pick-up module comprising:

an image pickup lens member;

a lens frame member retaining the lens member, a semiconductor circuit section having a photoelectric conversion section comprised of two-dimensionally arranged photoelectric conversion element groups, a drive circuit section sequentially driving the photoelectric conversion elements and obtaining a signal charge, and an A/D conversion section converting the signal charge to a digital signal, the photoelectric conversion section, drive circuit section and A/D conversion section being formed on the same semiconductor chip; and a substrate retaining the semiconductor chip and having electrode groups electrically connected to the semiconductor chip in which, p1 on one surface of the substrate, a positioning reference surface comprised of an equally flattened surface is defined, the positioning reference surface includes a semiconductor chip positioning reference surface portion at which the semiconductor chip is joined in a planar way and positioned and a lens frame positioning reference surface portion situated around the semiconductor chip and left as a remaining portion at the outer peripheral end portion of the positioning reference surface, and at which the lens frame member is joined upon being mounted and positioned, and in which the semiconductor chip and lens frame member are positioned on the positioning reference surface constituted of the equally flattened surface defined on the one surface of the substrate while using the semiconductor chip positioning reference surface portion and an lens frame member positioning reference surface portion.

3. An image pick-up module comprising:

an image pick-up lens member;

a lens frame member holding the lens member;

a semiconductor circuit section having a photoelectric conversion section comprised of two-dimensional arranged photoelectric conversion element groups, a drive circuit section sequentially driving photoelectric conversion element groups and obtaining a signal charge, an A/D conversion section converting the signal charge to a digital signal, a signal processing section outputting the digital signal as a video signal, and light exposure control means electrically controlling a light exposure time on the basis of an output level of the digital signal, the photoelectric conversion section, drive circuit section, A/D conversion section, signal processing section and light exposure control means being formed on the same chip; and a substrate retaining the semiconductor chip and having electrode groups electrically connected to the semiconductor chip, in which, on one surface of the substrate, a positioning reference surface constituted of an equally flattened surface is formed, the positioning reference surface has a semiconductor chip positioning reference surface portion joined in a planar way and positioned, and a lens frame member positioning reference surface portion situated around the semiconductor chip, left as a remaining portion at an outer peripheral end portion of the positional reference surface and at which the lens frame member is joined upon being mounted and positioned, and in which the semiconductor chip and lens frame member are positioned on the positioning reference surface of the equally flattened surface defined on the one surface of the substrate while using the reference surface portion at which the semiconductor chip is joined and positioned an reference surface portion at which the lens frame member is joined an positioned.

4. An image pick-up module according to claim 2 or 3, in which an optical member is assembled in the lens frame member in an air-tight state to provide the lens frame member as a hermetic structure and a joined section between the lens frame member and the reference surface is sealed, and the semiconductor chip is sealed with the lens frame member.

5. An image pick-up module according to claim 2 or 3 or 4, in which an optical member such as an infrared ray shutting member, lens or optical window member is assembled in an air-tight state on the lens frame member to provide a lens frame unit, and a joined section between the lens frame unit and the reference surface is sealed in an air-tight fashion and the semiconductor chip is sealed with the lens frame unit.

6. An image pick-up module according to claim 2 or 3 or 4 in which a dust-tight transparent member is arranged outside the lens frame member to provide an airtight transparent member and a surface joined to the reference surface is sealed and the semiconductor chip is sealed with the lens frame member.

7. An image pick-up module according to claim 2 or 3 or 4, in which the optical member assembled on the lens frame member recedes to a position more away from the semiconductor chip than an inner wall surface of the lens frame member facing the semiconductor chip and is located within a thickness range of the optical axis direction of the wall section of the lens frame member.

8. An image pick-up module according to claim 1 or 2 or 3, in which the semiconductor substrate is comprised of a bulk type ceramics substrate.

9. An image pick-up module according to any of claims 1 to 8, in which the positioning reference surface is wholly formed up to an outer peripheral end of the substrate and electrode groups are located at the outer end portion of the substrate.

10. An image pick-up module according to claim 1 or 2 or 3 in which at one end of the lens frame member facing the positioning reference surface, abutting projections are provided which abut against the positioning reference surface except at the electrode groups of the substrate, and recesses are provided in those positions facing the electrode groups, and astride and away from the electrode groups.

11. An image pick-up module according to claim 1, in which the lens frame member is fitted over the outer periphery of the frame member for covering; at that fitting section between the frame member and the lens frame member, projections are provided at one of the frame member and lens frame member to allow the projections of the one member to be joined to the other member; and the frame member and lens frame member are positioned by the projections and a clearance is provided between the frame member and the lens frame member.

12. An image pick-up module according to claim 1, in which the infrared ray shutting optical member is comprised of a multi-layered type infrared ray elimination filter.

13. An image pick-up module according to any of claims 1 to 12, in which a stationary stop aperture is provided at the forward end portion of the lens frame member.

14. An image pick-up module according to any of claims 1 to 13, in which, at a forward end portion of the lens frame member, a cylindrical wall is provided around an area of the stop aperture.

15. An image pick-up module according to any one of claims 1 to 14, in which a protective film is coated on the electrode groups at least at those portions where other members are joined.

16. An image pick-up module according to any one of claims 1 to 15, in which the electrode groups are provided at the positioning reference surface of the substrate except at an area where the lens frame member is joined.

17. An image pick-up module according to claim 10, in which no coating is made at that area of the electrode groups corresponding to the recess.

18. A method of assembling an image pick-up module comprising:

an image pick-up module lens member;

a lens frame member retaining the lens member;

a semiconductor circuit section wherein a photoelectric conversion section composed of two-dimensionally arranged photoelectric conversion element groups, a drive circuit section sequentially driving the photoelectric conversion element groups and obtaining a signal charge, and an A/D conversion section converting the signal charge into a digital signal, are formed on the same semiconductor chip; and a substrate holding the semiconductor chip and having electrode groups electrically connected to the semiconductor chip, the method comprising:

preparing a substrate, a semiconductor chip positioning reference surface and a lens frame positioning reference surface being formed on a surface of the substrate and a lens frame positioning reference surface portion being situated around the semiconductor chip positioning reference surface; as a single flat surface;

mounting and positioning a semiconductor chip on the semiconductor chip positioning reference surface of the substrate; and mounting and positioning the lens frame on the lens frame positioning reference surface of the substrate.

19. An image pick-up module according to claim 9, wherein the substrate has wiring which connects the electrode groups and the semiconductor chip.

* * * * *